(12) United States Patent
Satake

(10) Patent No.: US 7,870,532 B2
(45) Date of Patent: Jan. 11, 2011

(54) LITHOGRAPHY SIMULATION METHOD, METHOD OF MANUFACTURING A SEMICONDUCTOR DEVICE AND PROGRAM

(75) Inventor: Masaki Satake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 398 days.

(21) Appl. No.: 12/042,879

(22) Filed: Mar. 5, 2008

(65) Prior Publication Data

US 2008/0220376 A1     Sep. 11, 2008

(30) Foreign Application Priority Data

Mar. 5, 2007     (JP)     ............... 2007-054650

(51) Int. Cl.
*G06F 17/50* (2006.01)
(52) U.S. Cl. .................. 716/21; 716/19
(58) Field of Classification Search ........... 716/19, 716/21; 430/319; 382/144
See application file for complete search history.

(56) References Cited

U.S. PATENT DOCUMENTS 7,079,223 B2 *   7/2006   Rosenbluth et al. ........... 355/67
7,233,887 B2 *   6/2007   Smith ........................... 703/2

OTHER PUBLICATIONS

Adam; "Modeling Electromagnetic Effects From Mask Topography At Full-Chip Scale", Proceedings of SPIE, vol. 5754, pp. 498-505, (2005).
Erdmann et al.; "Mask and Wafer Topography Effects in Immersion Lithography", Proceedings of SPIE, vol. 5754, pp. 383-395, (2005).
Bai et al.; "Approximation of Three Dimensional Mask Effects With Two Dimensional Features", Proceedings of SPIE, vol. 5751, pp. 446-455, (2005).

* cited by examiner

*Primary Examiner*—Sun J Lin
(74) *Attorney, Agent, or Firm*—Finnegan, Henderson, Farabow, Garrett & Dunner, L.L.P.

(57) ABSTRACT

A lithography simulation method of obtaining a resist image by a simulation using a first function and a second function, the lithography simulation method comprising: determining a mask transmission function from a mask layout, modulating the mask transmission function using the first function to determine a modulated mask transmission function, obtaining an optical image of the mask layout using the modulated mask transmission function, and applying the second function to the optical image to obtain the resist image of the mask layout.

16 Claims, 7 Drawing Sheets

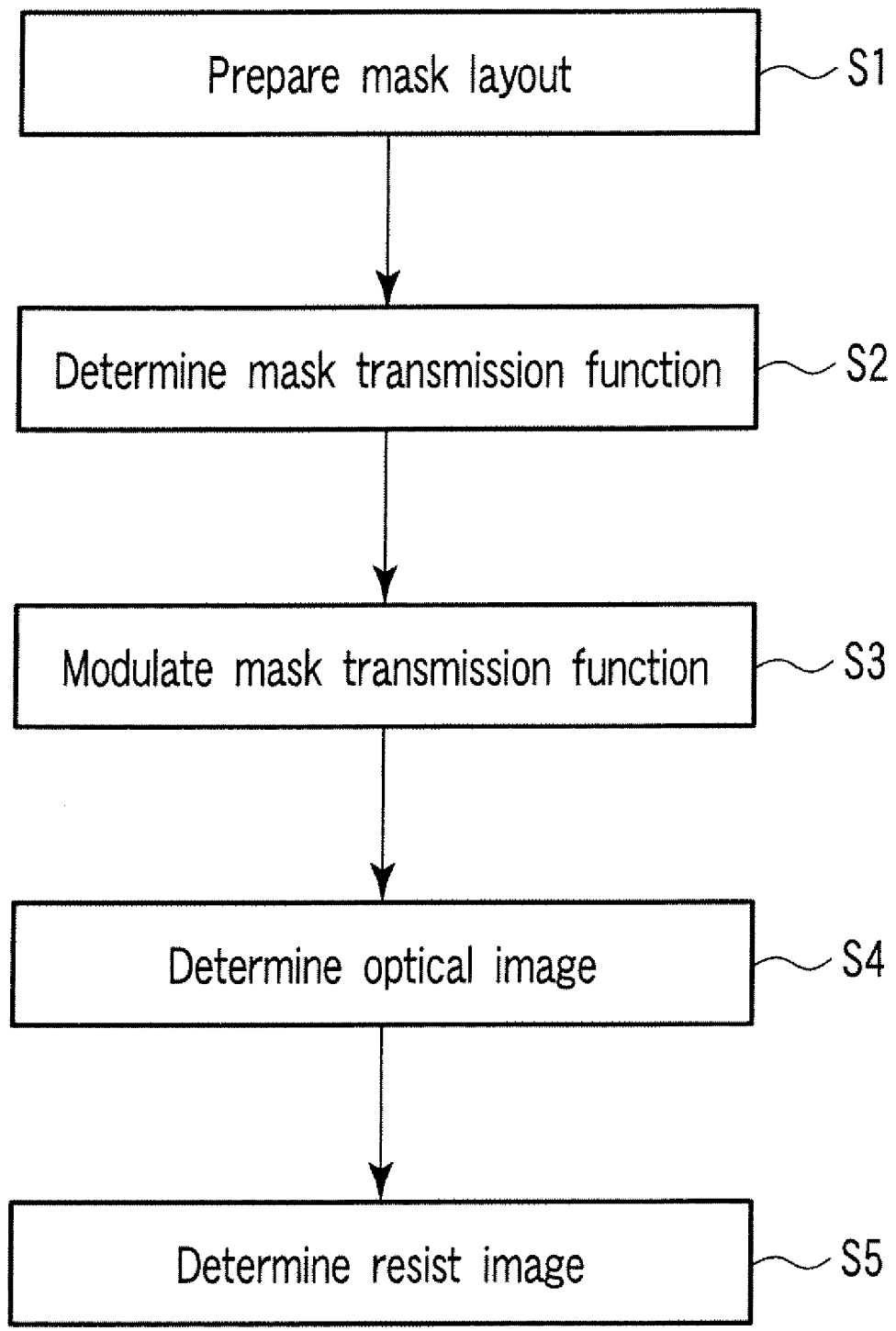
F I G. 1

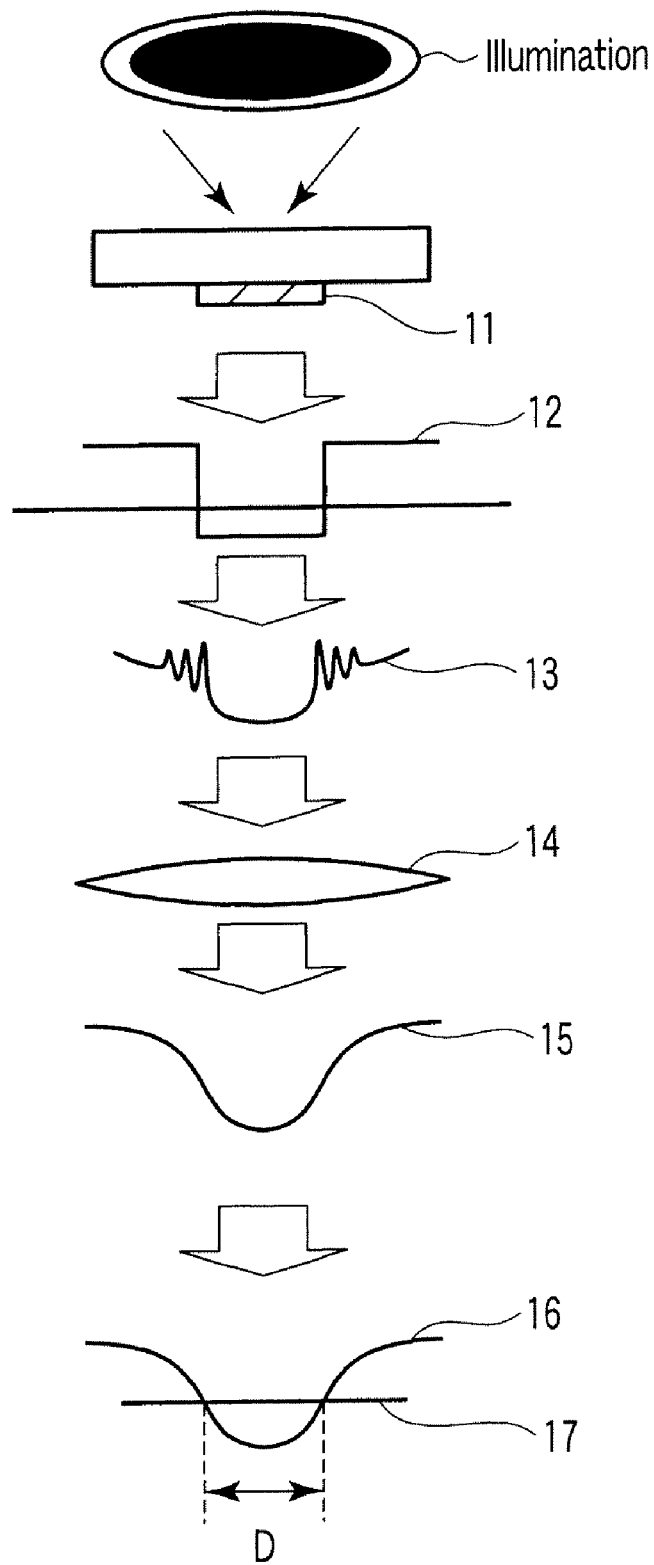
F I G. 2

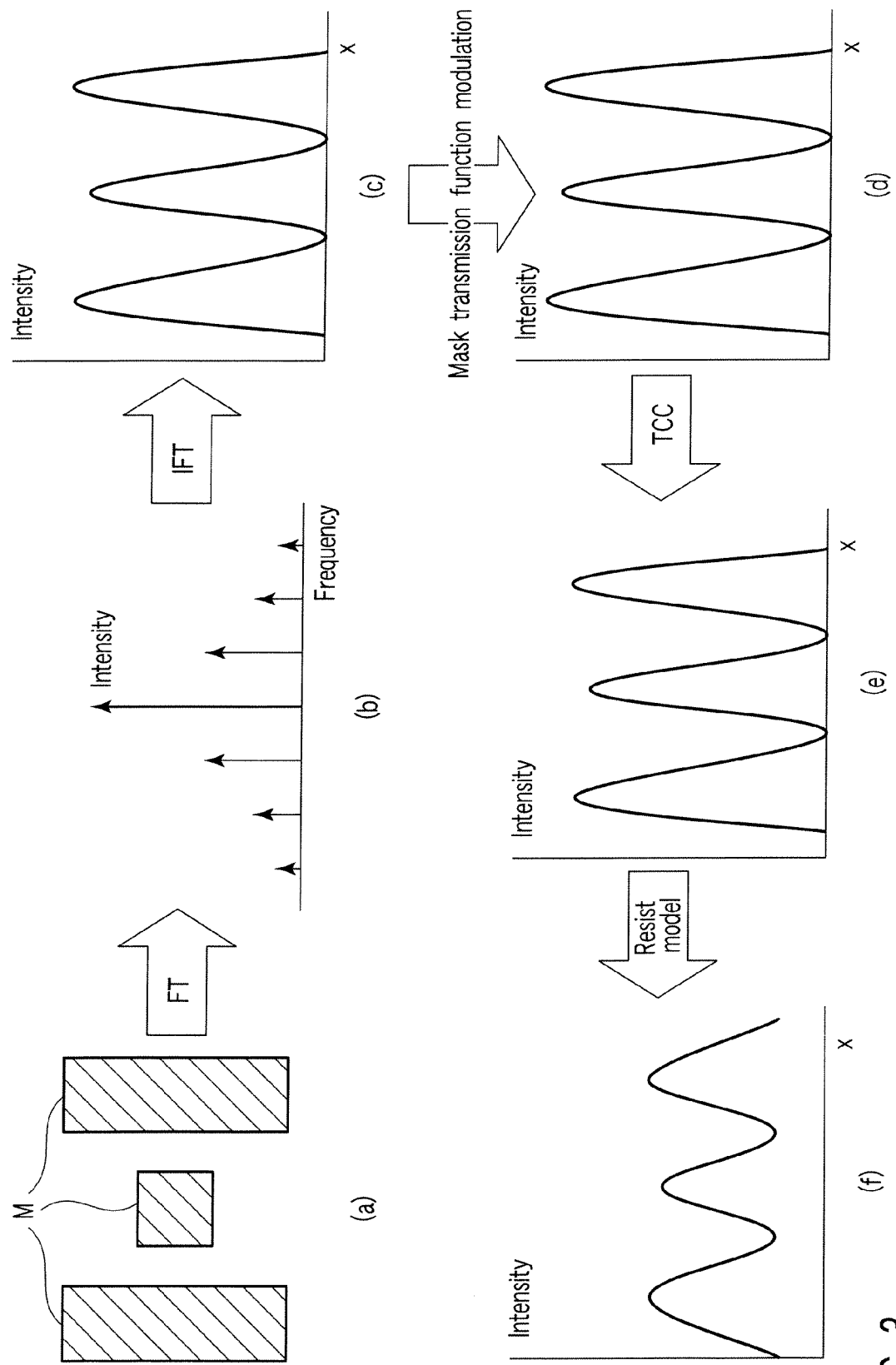
F I G. 3

US 7,870,532 B2

LITHOGRAPHY SIMULATION METHOD, METHOD OF MANUFACTURING A SEMICONDUCTOR DEVICE AND PROGRAM

CROSS-REFERENCE TO RELATED APPLICATIONS

This application is based upon and claims the benefit of priority from prior Japanese Patent Application No. 2007-054650, filed Mar. 5, 2007, the entire contents of which are incorporated herein by reference.

BACKGROUND OF THE INVENTION

1. Field of the Invention

The present invention relates to a lithography simulation method.

2. Description of the Related Art

Advance in scale-reduction of a mask pattern (mask layout) has made, and thereby, it is difficult to secure lithography simulation accuracy.

For example, a large difference occurs between the following two simulation results (e.g., see "Proc. SPIE2005, vol. 5754, p. 383-394, March 2005). One is a simulation result obtained by a thin mask approximation model. Another is a simulation result obtained by strict calculation considering mask topography effect. Therefore, the following strict calculation needs to make high accuracy simulation. Specifically, a strict calculation must be made considering the mask topography effect, that is, an electromagnetic field in the vicinity of a mask. However, if the strict calculation considering the mask topography effect is made, there is a problem that a large number of calculations are required.

As a result, it is conventionally difficult to carry out high accuracy lithography simulation considering the mask topography effect using a simple method.

BRIEF SUMMARY OF THE INVENTION

A first aspect of the present invention, there is provided a lithography simulation method of obtaining a resist image by simulation using first and second functions, obtaining the resist image by the simulation comprising: determining a mask transmission function from a mask layout; modulating the mask transmission function using the first function to determine a modulated mask transmission function; obtaining an optical image of the mask layout using the modulated mask transmission function; and applying the second function to the optical image to obtain the resist image of the mask layout.

A second aspect of the present invention, there is provided a computer readable medium configured to store program instructions for execution on a computer, the program instructions being applied to a lithography simulation of obtaining a resist image by simulation using first and second functions, the program instructions causing the computer to perform: determining a mask transmission function from a mask layout; modulating the mask transmission function using the first function to determine a modulated mask transmission function; obtaining an optical image of the mask layout using the modulated mask transmission function; and applying the second function to the optical image to obtain the resist image of the mask layout.

BRIEF DESCRIPTION OF THE SEVERAL VIEWS OF THE DRAWING

FIG. 1 is a flowchart to explain a basic procedure of a lithography simulation method according to an embodiment of the present invention;

FIG. 2 is a view to explain a basic concept of the lithography simulation method according to the embodiment of the present invention;

FIG. 3 is a view to detailedly explain part of the lithography simulation method according to the embodiment of the present invention;

DETAILED DESCRIPTION OF THE INVENTION

An embodiment of the present invention will be hereinafter described with reference to the accompanying drawings.

FIG. 1 is a flowchart to explain a basic procedure of a lithography simulation method according to an embodiment of the present invention. FIG. 2 is a view to explain a basic concept of the lithography simulation method according to the embodiment of the present invention. FIG. 3 is a view to detailedly explain part of the lithography simulation method according to the embodiment of the present invention. Hereinafter, the lithography simulation method according to this embodiment will be explained with reference to the foregoing drawings.

Prepare data of a mask layout (mask pattern to be formed on a photo mask) used as a lithography simulation object (S1). In this case, data of a mask layout M shown in FIG. 3(a) is prepared.

Determine a mask transmission function 12 from the mask layout 11. In other words, light transmission characteristic of the mask layout M is determined. According to this embodiment, Fourier transform is made with respect to mask data of the mask layout M (see FIG. 3(b)). Inverse Fourier transform is further made (see FIG. 3(c)). In other words, FIG. 3(b) shows a mask transmission function in frequency domain. FIG. 3(c) shows a mask transmission function in space domain.

The mask transmission function 12 is modulated using mask transmission function modulation function (first function) to obtain a modulated mask transmission function 13 (S3). In other words, the mask transmission function modulation function is applied to the mask transmission function shown in FIG. 3(c) to calculate a modulated mask transmission function shown in FIG. 3(d). Hereinafter, the foregoing process will be detailedly explained.

As already described, scale-reduction of the mask layout advances, and thereby, it is difficult to obtain a high-accuracy simulation result in the lithography simulation using thin mask approximation model. For this reason, strict calculation considering mask topography effect is required to carry out high-accuracy lithography simulation. In other words, strict calculation considering a thickness of a pattern formed on a photo mask is required. However, a large amount of calculations are required in the foregoing strict calculation considering mask topography effect. In order to solve the foregoing problem, according to this process, the mask transmission function is modulated using a mask transmission function modulation function approximately reflecting the mask topography effect.

Figure 4:
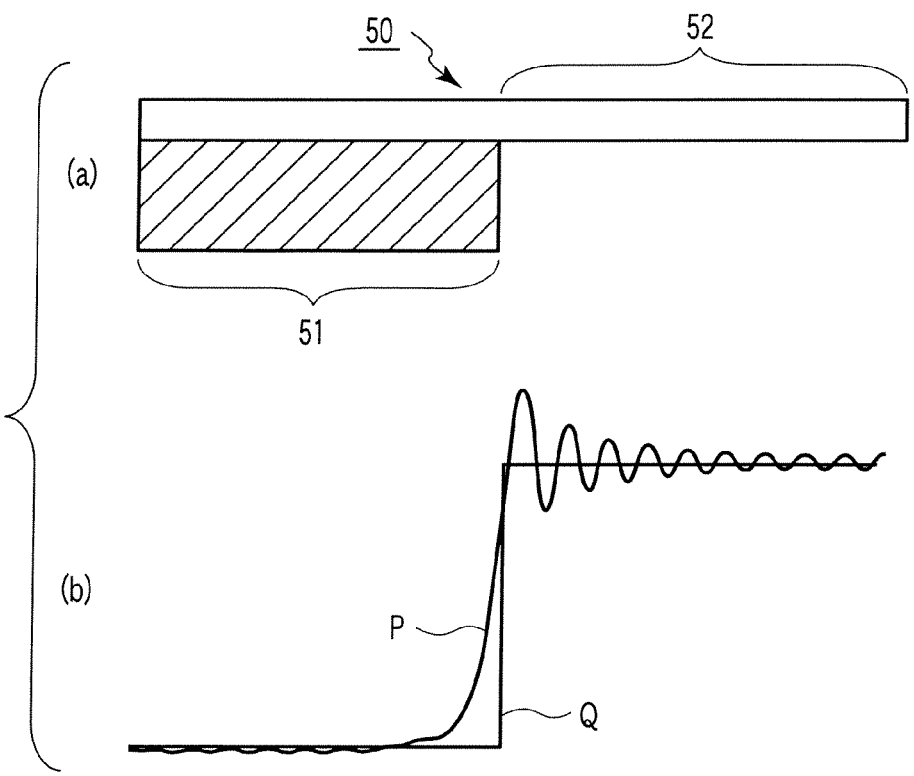
FIG. 4 is a view to explain mask topography effect according to the embodiment of the present invention.
Figure 5:
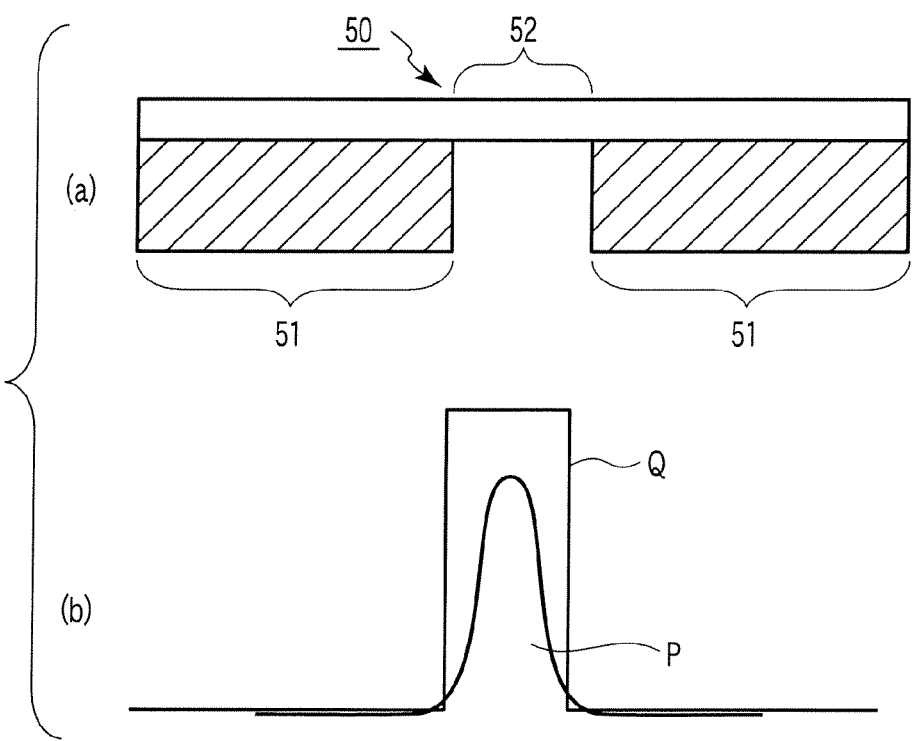
FIG. 5 is a view to explain mask topography effect according to the embodiment of the present invention.

FIG. 4 and FIG. 5 are views to explain about the mask topography effect. FIG. 4(a) and FIG. 5(a) are views schematically showing a photo mask. In FIG. 4(a) and FIG. 5(a), 50 denotes a photo mask, and 51 denotes an opaque area, and further, 52 denotes a clear area. FIG. 4(b) and FIG. 5(b) are views showing electric field distribution of light transmitting through the photo mask 50. In FIG. 4(b) and FIG. 5(b), a symbol P denotes an actual electric field distribution based on mask topography effect. Q denotes an electric field distribution using thin mask approximation.

The mask topography effect is largely classified into edge scattering effect, oblique effect and waveguide effect. According to the edge scattering effect, scattering phenomenon occurs in the electric field distribution at the boundary (edge) between the opaque area 51 and the clear area 52 of the photo mask 50, as seen from FIG. 4. Basically, the edge scattering effect occurs at all edges. According to the foregoing oblique effect and waveguide effect, the following phenomenon occurs. Namely, light passing through the clear area 52 between opaque areas 51 attenuates, as shown in FIG. 5. The width (space width) of the clear area 52 gradually becomes narrow, and thereby, the oblique effect and the waveguide effect increase. The oblique effect is a phenomenon such that light intensity attenuates at the boundary (edge) between the opaque area 51 and the clear area 52 resulting from oblique incident light (i.e., light obliquely incident on the photo mask 50). The waveguide effect is a phenomenon such that light intensity pasting through the clear area 52 attenuates. The width (space width) of the clear area 52 becomes narrow, and thereby, the waveguide effect remarkably appears in particular. According to this embodiment, the mask transmission function is modulated using mask transmission function modulation function approximately reflecting the foregoing oblique effect and waveguide effect.

Figure 6:
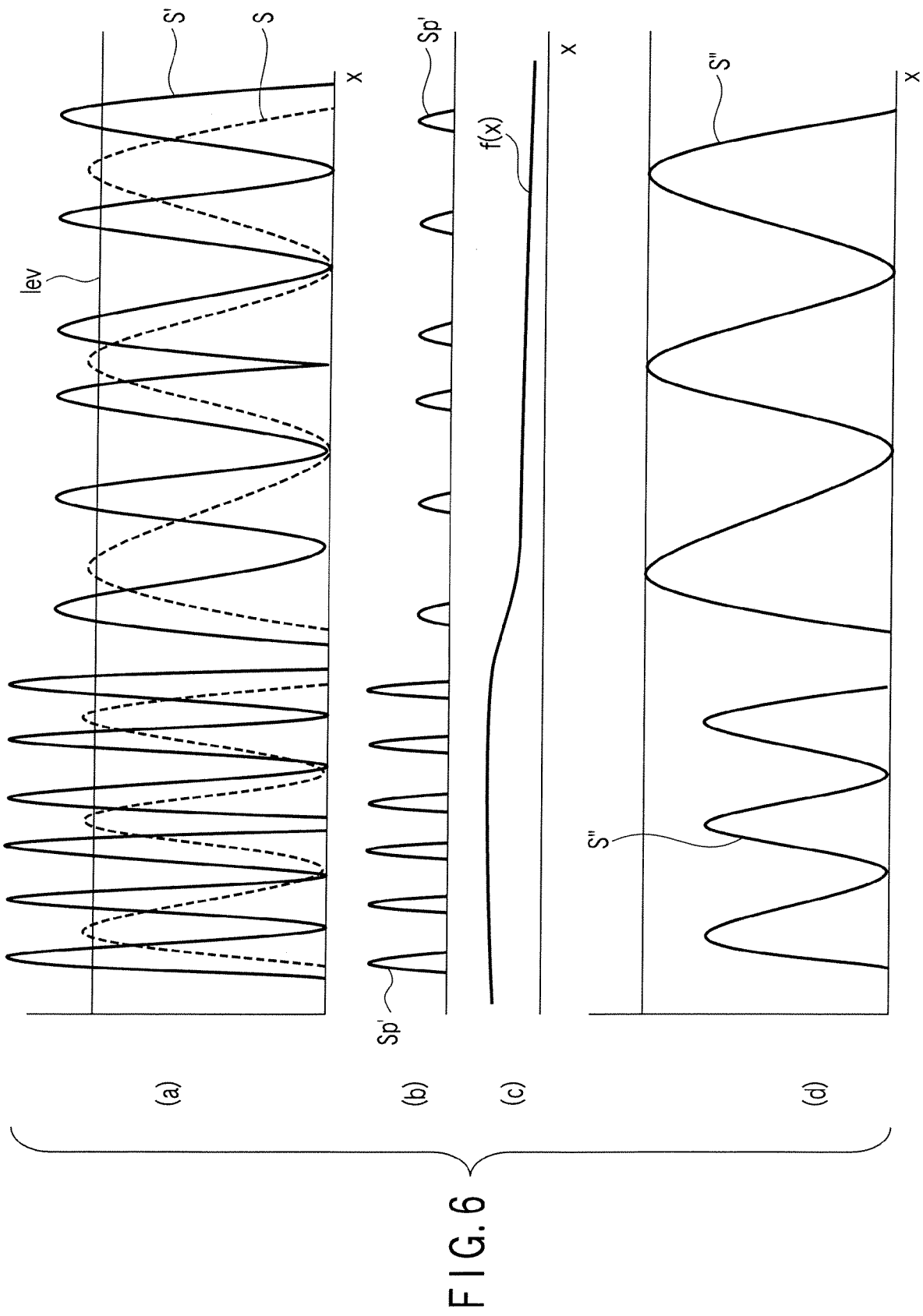
FIG. 6 is a view to explain mask function modulation according to the embodiment of the present invention.

FIG. 6 is a view to explain the mask transmission function modulation function. The mask transmission function modulation function shown in FIG. 6 is called "exslope".

As shown in FIG. 6(a), a mask transmission function S is differentiated to determine a function S' (first preliminary function) expressing the gradient of the mask transmission function S. As seen from FIG. 6(a), the density of the mask layout increases, and thereby, the gradient of the mask transmission function S increases. For this reason, the absolute value (amplitude level) of the function S' increases. Then, the function S' is sliced at a predetermined level lev. As depicted in FIG. 6(b), portions Sp' exceeding the predetermined level lev, of the function S' are extracted. Specifically, the following relation and equation are given.

When the relation is S'>lev, Sp'=S'−lev
When the relation S'=<lev, Sp'=0

As seen from FIG. 6(c), a function $f(x)$ (second preliminary function) is calculated based on the extracted portions Sp' of the function S'. Specifically, convolution integral of the extracted portion Sp' of the function S and a Gauss function having standard deviation σ is made to calculate the function $f(x)$. In this case, the function $f(x)$ is a function such that the absolute value increases when the density of the mask layout increases. As shown in FIG. 6(d), the function $f(x)$ is applied to the mask transmission function S to modulate the mask transmission function, calculating a modulated mask transmission function S". For example, the modulated mask transmission function S" is obtained from the following equation.

$$S''=S/(1+w*f(x))$$

where, w is a fitting parameter for fitting S" to an experimental value.

In the manner described above, the mask transmission function modulation function (first function) is applied to the mask transmission function 12. In this way, the modulated mask transmission function 13 is calculated.

The mask topography effect is properly reflected to the modulated mask transmission function obtained in the manner described above. In particular, the foregoing oblique effect and waveguide effect shown in FIG. 5 are properly reflected. As already described, the width (space width) of the clear area of the photo mask gradually becomes narrow, and thereby, the foregoing oblique effect and waveguide effect increase. In other words, the width (space width) of the clear area of the photo mask gradually becomes narrow, and thereby, a quantity of attenuation of light passing through the clear area increases. In general, the width (space width) of the clear area becomes narrow in an area where the pattern density of the mask layout is high (the distance between patterns is narrow). Therefore, the pattern density of the mask layout becomes high, and thereby, a quantity of attenuation of light passing through the clear area increases. As seen from FIG. 6, the mask transmission function S and the modulated mask transmission function S" properly reflect the relationship described above.

Thus, the mask transmission function modulation function shown in FIG. 6 is employed, and thereby, the mask topography effect can be approximately reflected. As a result, it is possible to carry out high-accuracy simulation without increasing an amount of calculations. In other words, even if the thin mask approximation model (the thickness of the pattern on the photo mask is set to zero), which does not take the mask topography effect into consideration, is used, high-accuracy simulation is effected.

The slice level "lev" shown in FIG. 6(a) is properly set, and thereby, the extracted portion Sp' shown in FIG. 6(b) can be made zero in an area where the pattern density is low (the distance between patterns is wide). As a result, the function $f(x)$ of FIG. 6(c) is made zero in a low pattern density area. In this case, a relation ⌈S"=S⌋ is given. Therefore, the value of the mask transmission function S is kept after it is modulated in the low pattern density area, that is, in an area where there is substantially no influence of oblique effect and waveguide effect. In view of the foregoing circumstances, it is possible to obtain a high-accuracy simulation model.

According to this embodiment, the "exslope" shown in FIG. 6 is used as the mask transmission function modulation function. The following "slope" or "double Gaussian" may be used as the mask transmission function modulation function.

The "slope" is express from the following equation.

$$P(x, y)=S(x, y)\times\exp(\beta|g|)$$

$$g=(1/S(x, y))\times((\partial S/\partial x)^2+(\partial S/\partial y)^2)^{1/2}$$

where, S(x, y) is a mask transmission function before modulated, and P(x, y) is a modulated mask transmission function, and further, β is a fitting parameter.

The "double Gaussian" is expressed from the following equation.

$$P(x, y) = w1 \times G(x, y, \sigma1) * S(x, y) + w2 \times G(x, y, \sigma2) * S(x, y)$$

where, S(x, y) is a mask transmission function before modulated, P(x, y) is a modulated mask transmission function, G(x, y, σ) is a Gauss function, and σ1, σ2, w1 and w2 are fitting parameters. Further, "*" expresses a convolution integral.

An optical image of the mask layout 11 (mask layout M) is determined using the modulated mask transmission function 13 (S4). Specifically, as illustrated in FIG. 2, an image of the mask layout 11 after passing an optical system 14 of an exposure apparatus is determined as an optical image 15. The optical image 15 is defined based on light intensity distribution of light passing through the optical system 14. In FIG. 3, an optical image shown in FIG. 3(e) is calculated from the modulated mask transmission function of FIG. 3(d).

Partial coherent imaging expressed by the following equations (1) and (2) is usable to calculate the optical image 15.

$$I(x, y) = \int\int\int S(f, g)P(f + f_1, g + g_1)P^*(f + f_2, g + g_2) \quad (1)$$
$$\hat{m}(f_1, g_1)\hat{m}^*(f_2, g_2) \cdot \exp(-2\pi i((f_1 - f_2)x + (g_1 - g_2)y))$$
$$df_1 dg_1 df_2 dg_2{}_1 df dg$$
$$= \int S(f, g) \left| \int P(f + f_1, g + g_1)\hat{m}(f_1, g_1) \right.$$
$$\left. \exp(-2\pi i(f_1 x + g_1 y))df_1 dg_1 \right|^2 df dg$$

$$I(x, y) = \int \left( \int\int TCC(f + f_1 g + g_1; f_1, g_1)\hat{m}(f + f_1, g + g_1) \right. \quad (2)$$
$$\left. \hat{m}^*(f_1, g_1)df_1 dg_1 \right) \exp(-2\pi i(fx + gy))df dg$$

where, I(x, y) is light intensity distribution (optical image) at a point (x, y) calculated using a thin mask approximation model, S is intensity distribution of effective light source, P is a pupil function of an optical system, * is a complex conjugate, m^ is a Fourier transform of complex transmission distribution of a mask pattern, and TCC is a transfer function called as a transmission cross coefficient. According to this embodiment, the foregoing equation (2) is employed using a quadrupole illumination having NA of 1.0 and coherent factor of 0.95.

The predetermined function (second function) is applied to the optical image 15 to determine a resist image 16 of the mask layout (S5). In FIG. 3, a resist image shown in FIG. 3(f) is calculated from the optical image shown in FIG. 3(e). Specifically, the resist image 16 is calculated using a model simply (approximately) expressing a reaction in a photo resist onto which exposure light is applied (reaction of acid in photo resist). "Gaussian", "mask Gaussian" and excess acid model" are given as a model simply expressing a reaction in the photo resist. Hereinafter, the foregoing models will be explained.

The "Gaussian" is expressed by the following equation.

$$P(x, y) = w \times G(x, y, \sigma) * I(x, y)$$

where, P(x, y) is a resist image at a point (x, y), I(x, y) is an optical image, G(x, y, σ) is a Gauss function having standard deviation σ, and w is a fitting parameter. Further, "*" expresses a convolution integral.

The "mask Gaussian" is expressed by the following equation.

$$P(x, y) = I(x, y) + w \times G(x, y, \sigma) * S(x, y)$$

where, P(x, y) is a resist image at a point (x, y), I(x, y) is an optical image, G(x, y, σ) is a Gauss function having standard deviation σ, S(x, y) is a mask transmission function, and w is a fitting parameter. Further, "*" expresses a convolution integral.

The "excess acid model" is expressed by the following equations and calculation procedures (a) to (c).

Procedure (a)
When a relation of I>lev is given, I'=I–lev
When a relation of I=<lev is given, I'=0
where, I is an optical image, lev is a parameter for extracting predetermined optical image intensity or more.

Procedure (b)

$$I''(x, y) = G(x, y, \Delta L) * I'(x, y)$$

where, G(x, y, ΔL) is a Gauss function having a diffusion length ΔL (corresponding to standard deviation), and "*" expresses a convolution integral.

Procedure (c)

$$I'''(x, y) = I(x, y) + w \times I''(x, y)$$

where, w is a fitting parameter.

The resist image 16 of the mask layout is determined in the manner described above. Then, the obtained resist image 16 is sliced at a predetermined level 17. A slice width D obtained at that time is given as a resist pattern dimension (CD value) of the target mask layout.

As described above, according to this embodiment, the mask transmission function is modulated using the mask transmission function modulation function (first function) approximately reflecting the mask topography effect. Then, the optical image of the mask layout is determined using the modulated mask transmission function. Thus, it is possible to carry out high-accuracy lithography simulation approximately reflecting the mask topography effect without making a large amount of strict calculations considering mask topography effect. Therefore, according to this embodiment, high-accuracy lithography simulation is realizable using a simple method.

According to this embodiment, in order to obtain the modulated mask transmission function, the preliminary function (e.g., function ƒ(x) of FIG. 6(c)) such that when mask layout density increases, the absolute value increases is determined from the mask transmission function. Thereafter, the mask transmission function is modulated so that when the absolute value of the preliminary function increases, the absolute value decreases. The foregoing method is employed, and thereby, it is possible to realize high-accuracy lithography simulation properly reflecting mask topography effect, in particular, oblique effect and waveguide effect.

Parameters included in the foregoing various functions (fitting parameters included in the first and second functions) are previously determined based on the following resist pattern dimension. The resist pattern dimension is obtained from a resist pattern of a test pattern formed by the actual lithography, or from a resist image of a test pattern obtained by a desired simulation different from the foregoing simulation of this embodiment. Specifically, the fitting parameter is previously determined so that a resist dimension obtained by the lithography simulation of this embodiment is close to a resist dimension to be fitted as much as possible. The desired simulation different from the foregoing simulation of this embodiment includes simulation using strict calculation based on a strictly physical model reflecting mask topography effect. Hereinafter, explanations will be described.

Figure 7A:
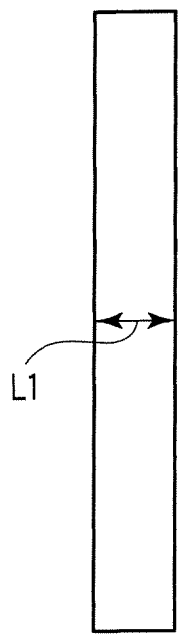
FIGS. 7A to 7D are views showing various test patterns for experimentally obtaining parameters according to the embodiment of the present invention.
Figure 7B:
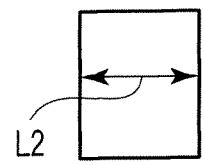
Figure 7C:
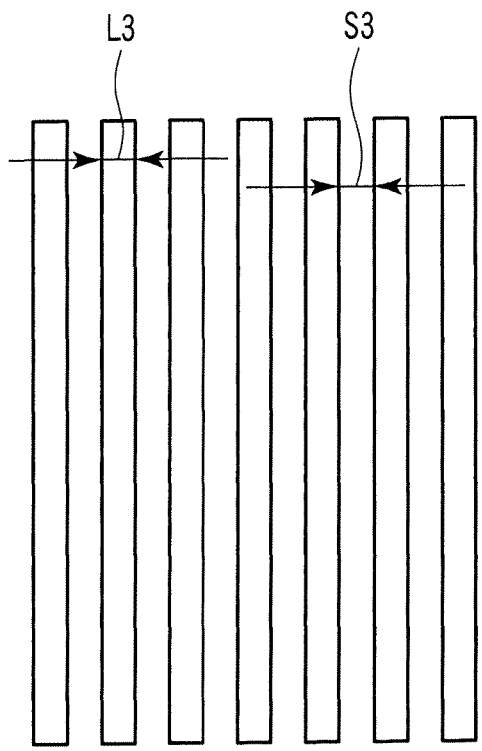
Figure 7D:
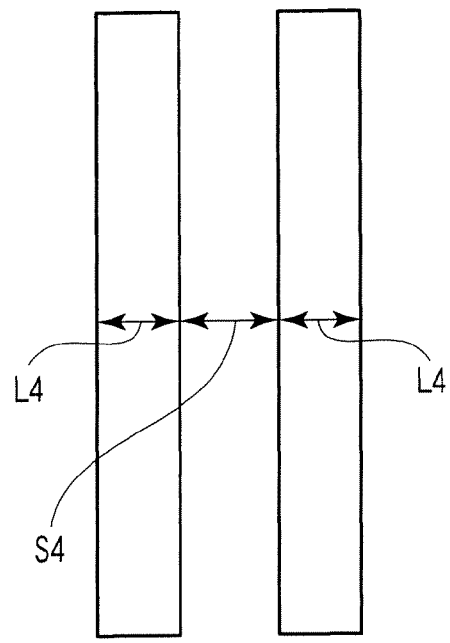

FIGS. 7A to 7D are views showing various test patterns for experimentally obtaining parameters. FIG. 7A is a view showing an isolated pattern. FIG. 7B is a view showing an island pattern. FIG. 7C is a view showing a line and space pattern. FIG. 7D is a view showing two lines pattern. In FIG. 7A to FIG. 7D, L1 to L4 denote a line width, and S3 and S4 denote a space width.

A plurality of test patterns having a different line width L1 is prepared as a test pattern shown in FIG. 7A. Likewise, a plurality of test patterns having a different line width L2 is prepared as a test pattern shown in FIG. 7B. A plurality of test patterns having different line width L3 and space width S3 is prepared as a test pattern shown in FIG. 7C. Likewise, a plurality of test patterns having different line width L4 and space width S4 is prepared as a test pattern shown in FIG. 7D. In the manner described above, for example, several hundreds of test patterns are prepared.

A resist pattern dimension of each test pattern is determined using the lithography simulation method of this embodiment. Namely, the resist pattern dimension is determined using the lithography simulation method shown in FIG. 1 to FIG. 3. Specifically, the resist pattern dimension is determined in the following manner.

A mask transmission function of the test pattern is determined. Then, the mask transmission function of the test pattern is modulated using the first function having a first parameter before fitting. The optical image of the test pattern is calculated using the modulated mask transmission function of the test pattern. The second function having a second parameter before fitting is applied to the optical image of the test pattern to calculate a resist image of the test pattern. The resist pattern dimension (e.g., corresponding to dimension D of FIG. 2) of the test pattern is calculated from the resist image thus obtained.

The following resist pattern dimensions are determined with respect to the foregoing each test pattern. One is a resist pattern dimension obtained by the actual lithography. Another is a resist pattern dimension obtained from the resist image determined using a desired simulation different from the simulation of this embodiment. In other words, a resist pattern dimension to be fitted is determined. The foregoing desired simulation includes simulation by strict calculation based on a strict physical model reflecting mask topography effect.

The resist pattern dimension obtained by the lithography simulation method of this embodiment is compared with a resist pattern dimension to be fitted. If the comparative result satisfies a predetermined condition, the first and second parameters before fitting are determined as the final first and second parameters. Specifically, the dimensional difference is calculated between the resist pattern dimension obtained by the lithography simulation of this embodiment and the resist pattern dimension to be fitted. The first and second parameters are simultaneously determined so that the dimensional difference becomes small as much as possible. For example, the first and second parameters are determined so that RMS (Root Mean Square) of the dimensional difference becomes the minimum.

Hereinafter, the evaluation result of the foregoing simulation will be descried. The foregoing "exslope" is used for the mask transmission function modulation function. Parameters lev=38, w=0.5 and σ=0.5 are set as the initial value of the fitting parameter (modulation parameter). The parameter σ=0.03 is set as the initial value of parameter to calculate the resist image in "Gaussian". Parameters σ=0.1 and w=0.05 are set in "mask Gaussian". Parameters lev=0.1, w=0.2 and ΔL=0.5 are set in "excess acid model".

Lithography simulation is carried out using the initial value of the fitting parameter. Then, the dimensional difference errCD is calculated between a resist dimensional value obtained by the lithography simulation and that obtained by the actual photolithography. Specifically, the RMS of the dimensional difference errCD is calculated with respect to 510 patterns (patters shown in FIG. 7).

The fitting parameters are perturbed to carry out the lithography simulation, and thereby, the dimensional difference errCD is calculated. Likewise, perturbation of the fitting parameters and calculations of the dimensional difference errCD are repeated. In this way, the fitting parameter is optimized so that the RMS of the errCD becomes the minimum.

Steepest descent method, simplex algorithm and genetic algorithm are given as the optimization algorithm of the foregoing multi-variable parameters. In this embodiment, the fitting parameter is optimized using the simplex algorithm.

In the "exslope" of the mask transmission function modulation function, when lev=41.747, w=−0.12267 and σ=0.89053, the RMS of the dimensional difference errCD becomes the minimum. In this case, a resist image model has a parameter σ=0.038898 in "Gaussian". The resist image model has parameters σ=0.12776 and w=−0.13547 in "mask Gaussian". The resist image model has parameters lev=0.054178, w=0.55388 and ΔL=−0.0070683 in "excess acid model". In this case, RMS is 2.49 nm.

Conversely, if the mask transmission function modulation function is not used (no modulation of mask function is made), the RMS is 5.5 nm.

Therefore, the method of this embodiment is employed, and thereby, it can be seen that accuracy of lithography simulation is improved.

As described above, according to this embodiment, the fitting parameter of the first function (mask transmission function modulation function) and that of the second function (function for determining resist image) are simultaneously determined based on the following pattern dimension. It is the pattern dimension of the resist pattern of the test pattern formed by the actual lithography (or the resist pattern dimension obtained from the resist image of the test pattern determined by a desired simulation different from the simulation of this embodiment). Namely, the fitting parameter of the first function (mask transmission function modulation function) is determined based on the pattern dimension of the actual resist pattern (or pattern dimension obtained by a desired simulation different from the simulation of this embodiment), in addition to the fitting parameter of the second function (for calculating the resist image). Therefore, the actual resist dimension value (or the resist dimensional value equivalent to the actual resist dimensional value) is accurately reflected to the fitting parameters of the first and second functions. Thus, it is possible to obtain a high-accuracy simulation model.

Moreover, it is unnecessary to make complicated simulation calculations (e.g., strict calculation reflecting mask topography effect) in order to calculate the fitting parameter based on the pattern dimension of the actually formed resist pattern. Thus, the fitting parameter is readily and speedy calculated.

Figure 8:
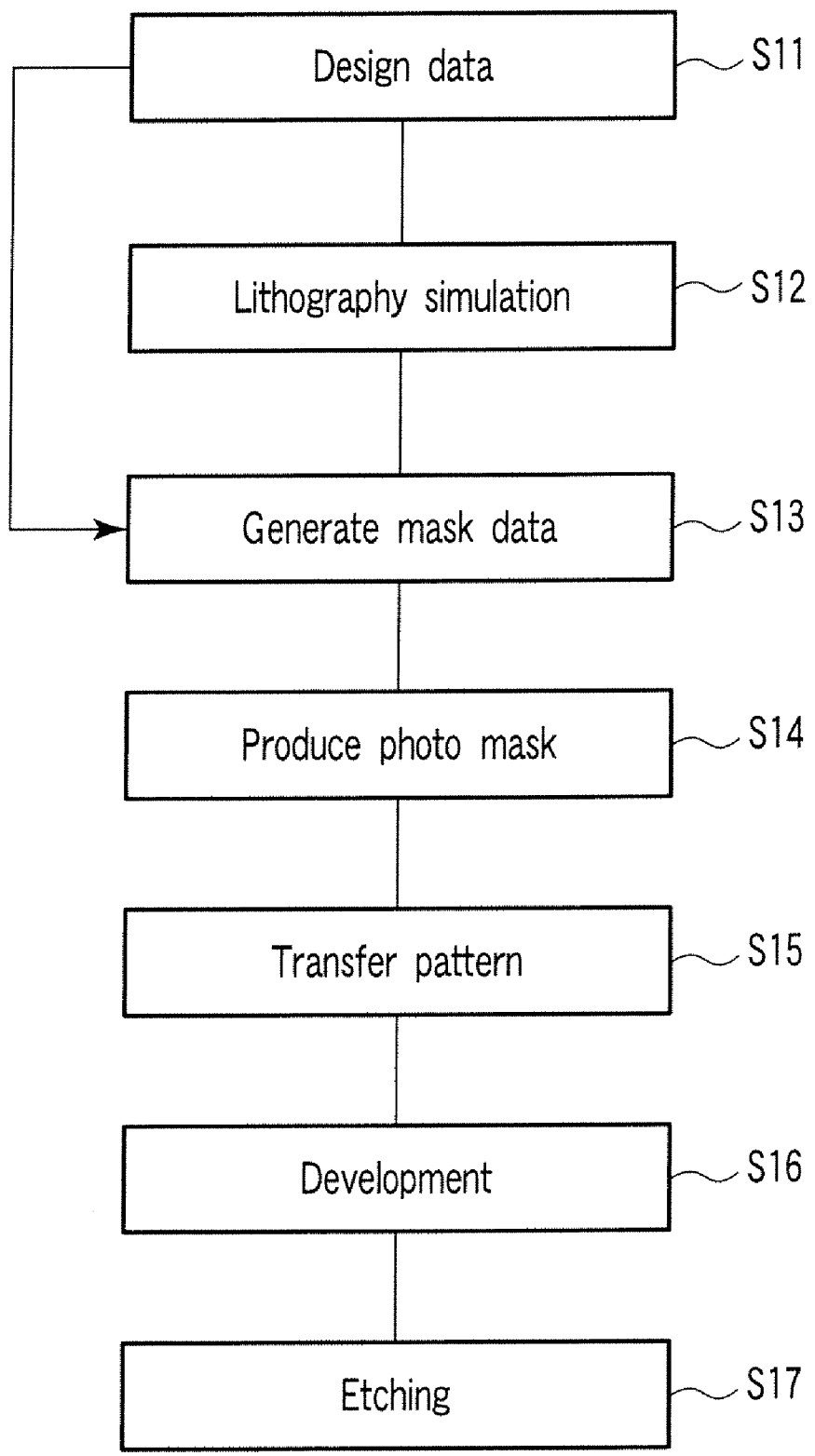
FIG. 8 is a flowchart to explain a method of manufacturing a semiconductor device according to an embodiment of the present invention.

The lithography simulation method described in the foregoing embodiment is applicable to a method of manufacturing a semiconductor device. FIG. 8 is a flowchart to schematically explain a method of manufacturing a semiconductor device.

A design data is prepared (S11). Then, lithography simulation is carried out using the method described in the foregoing embodiment (S12). Based on the guideline obtained by the lithography simulation, mask data is generated from the design data (S13). Based on the generated mask data, a photo mask is produced (S14). A pattern formed on the photo mask thus produced is transferred onto a photo resist on a semiconductor wafer (S15). The photo resist is developed to form a photo resist pattern (S16). Etching is carried out using the photo resist pattern as a mask to form a pattern on the semiconductor wafer (S17).

The method described in the foregoing embodiment is realizable by a computer whose operation is controlled by a program describing the procedures of the method. The foregoing program is provided via a recording medium such as magnetic disk or communication line (wired or wireless) such as Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lithography simulation method of obtaining a resist image by a simulation using, a first function and a second function, the lithography simulation method comprising steps performed by a computer of:
   determining a mask transmission function from a mask layout;
   modulating the mask transmission function using the first function to determine a modulated mask transmission function;
   obtaining an optical image of the mask layout using the modulated mask transmission function; and
   applying the second function to the optical image to obtain the resist image of the mask layout.

2. The lithography simulation method according to claim 1, wherein said to determine a modulated mask transmission function includes:
   modulating the mask transmission function so that when a density of the mask layout increases, an absolute value decreases.

3. The lithography simulation method according to claim 1, wherein said to determine a modulated mask transmission function includes:
   determining a first preliminary function from the mask transmission function such that when a density of the mask layout increases, an absolute value increases;
   extracting a portion of the first preliminary function which exceeds a predetermined level;
   determining a second preliminary function based on the extracted portion; and
   applying the second preliminary function to the mask transmission function to modulate the mask transmission function.

4. The lithography simulation method according to claim 3, wherein said determining a first preliminary function includes differentiating the mask transmission function.

5. The lithography simulation method according to claim 3, wherein said determining a second preliminary function includes carrying out a convolution integral with respect to the extracted portion and a Gauss function.

6. The lithography simulation method according to claim 1, wherein said determining a mask transmission function includes carrying out a Fourier transform with respect to data of the mask layout.

7. The lithography simulation method according to claim 1, wherein the first function approximately expresses a mask topography effect.

8. The lithography simulation method according to claim 1, wherein the optical image of the mask layout corresponds to an image of the mask layout after passing through an optical system.

9. The lithography simulation method according to claim 1, wherein the second function approximately expresses a reaction in a photo resist to which exposure light is applied.

10. The lithography simulation method according to claim 1, further comprising:
    obtaining a resist pattern dimension of the mask layout from the resist image.

11. The lithography simulation method according to claim 1, wherein the first function and the second function have previously fitted a first parameter and a second parameter, respectively.

12. The lithography simulation method according to claim 11, wherein obtaining the previously fitted first and second parameters includes:
    determining a mask transmission function of a test pattern;
    modulating the mask transmission function of the test pattern using a first function having a first parameter before fitting, thereby determining a modulated mask transmission function of the test pattern;
    obtaining an optical image of the test pattern using the modulated mask transmission function of the test pattern;
    applying a second function having a second parameter before fitting to the optical image of the test pattern to obtain a resist image of the test pattern;
    comparing a resist pattern dimension obtained from the resist image of the test pattern with a dimension of a resist pattern of the test pattern formed by an actual lithography to obtain a comparative result; and
    determining the first and second parameters before fitting as the previously fitted first and second parameters when the comparative result satisfies a predetermined condition.

13. The lithography simulation method according to claim 11, wherein obtaining the previously fitted first and second parameters includes:
    determining a mask transmission function of a test pattern;
    modulating the mask transmission function of the test pattern using a first function having a first parameter before fitting, thereby determining a modulated mask transmission function of the test pattern;
    obtaining an optical image of the test pattern using the modulated mask transmission function of the test pattern;
    applying a second function having a second parameter before fitting to the optical image of the test pattern to obtain a resist image of the test pattern;
    comparing a resist pattern dimension obtained from the resist image of the test pattern with a resist pattern dimension obtained from a resist image of the test pattern obtained by a desired simulation different from a simulation using the first and second functions to obtain a comparative result; and
    determining the first and second parameters before fitting as the previously fitted first and second parameters when the comparative result satisfies a predetermined condition.

14. The lithography simulation method according to claim 13, wherein the desired simulation includes a simulation based on a physical model reflecting a mask topography effect.

15. A method of manufacturing a semiconductor device, the method comprising:

producing a photo mask based on a result of the lithography simulation method according to claim 1; and transferring a pattern formed on the photo mask onto a photo resist on a semiconductor wafer.

16. A computer readable medium configured to store program instructions for execution on a computer, the program instructions being applied to a lithography simulation of obtaining a resist image by a simulation using a first function and a second function, the program instructions causing the computer to perform:

determining a mask transmission function from a mask layout;

modulating the mask transmission function using the first function to determine a modulated mask transmission function;

obtaining an optical image of the mask layout using the modulated mask transmission function; and applying the second function to the optical image to obtain the resist image of the mask layout.

\* \* \* \* \*

UNITED STATES PATENT AND TRADEMARK OFFICE
CERTIFICATE OF CORRECTION

| | | |
|---|---|---|
| PATENT NO. | : 7,870,532 B2 | Page 1 of 1 |
| APPLICATION NO. | : 12/042879 | |
| DATED | : January 11, 2011 | |
| INVENTOR(S) | : Satake | |

It is certified that error appears in the above-identified patent and that said Letters Patent is hereby corrected as shown below:

Claim 1, column 9, line 22, change "using, a first" to --using a first--.

Signed and Sealed this
Twenty-second Day of March, 2011

David J. Kappos
*Director of the United States Patent and Trademark Office*